(12) United States Patent
Lee

(10) Patent No.: US 7,573,413 B2
(45) Date of Patent: Aug. 11, 2009

(54) ELECTRONIC CIRCUIT PROTECTING AGAINST THE EFFECT OF INJECTION CURRENT AND ANALOG TO DIGITAL CONVERSION CIRCUIT

(75) Inventor: Kook-Pyo Lee, Incheon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/855,343

(22) Filed: Sep. 14, 2007

(65) Prior Publication Data

US 2008/0088494 A1    Apr. 17, 2008

(30) Foreign Application Priority Data

Sep. 14, 2006  (KR) .................. 10-2006-0089309

(51) Int. Cl.
*H03M 1/12*  (2006.01)

(52) U.S. Cl. .................. 341/155; 341/156; 341/172

(58) Field of Classification Search ........... 341/155, 341/156, 172
See application file for complete search history.

(56) References Cited

U.S. PATENT DOCUMENTS 5,023,614 A    6/1991    Fung et al.

FOREIGN PATENT DOCUMENTS

| JP | 07-183812 | 7/1995 |
|----|-----------|--------|
| JP | 2000-040964 | 2/2000 |
| JP | 2002-044322 | 2/2002 |
| JP | 2002-076866 | 3/2002 |
| JP | 2002-176346 | 6/2002 |
| JP | 2003-142963 | 5/2003 |
| KR | 1020050081044 A | 8/2005 |

*Primary Examiner*—Jean B Jeanglaude
(74) *Attorney, Agent, or Firm*—F. Chau & Assoc., LLC

(57) ABSTRACT

An electronic circuit includes a transmission circuit transmitting an input signal of a first node as an output signal of a second node in response to a control signal and a discharge circuit selectively discharging the input signal of the first node in response to the control signal.

7 Claims, 4 Drawing Sheets

ELECTRONIC CIRCUIT PROTECTING AGAINST THE EFFECT OF INJECTION CURRENT AND ANALOG TO DIGITAL CONVERSION CIRCUIT

CROSS-REFERENCE TO RELATED APPLICATION

This U.S. non-provisional patent application claims priority under 35 U.S.C. § 119 of Korean Patent Application No. 10-2006-89309, filed on Sep. 14, 2006, the entire contents of which are hereby incorporated by reference.

BACKGROUND OF THE INVENTION

The present disclosure relates to an electronic circuit and, more particularly, to an analog-to-digital converter (ADC).

An analog value may take any arbitrary value over a continuous range. Most physical parameters are expressed as analog values, that is, continuous values. Examples of the physical parameters expressed as analog values are temperature, pressure, intensity of light, voice signal, position, circulation speed, flow rate, and the like. On the other hand, a digital value is expressed as one of only two possible logic values, that is, 0 and 1. Actually, a digital value, for example, a voltage, is a specific value within a predetermined range, and it is defined as the same digital value within the given range.

All information to be inputted into a digital system should be converted into a digital form in advance of inputting. Hence, an information signal having an analog form should first be converted into an information signal having the digital form. An ADC converts an analog signal into a digital signal. Generally, analog to digital conversion is a procedure of sampling the analog value and converting the sampled analog value into a predetermined voltage or current corresponding to a digital code obtained by the sampling.

An ADC that receives two or more analog signals has a multiplexing structure at its input ports. In that ADC, only one input port for converting the digital signal into the analog signal is enabled and the other input ports must be disabled.

When a voltage higher than an internal voltage is applied to the disabled input ports of the ADC due to a malfunction of a sensor, however, a signal caused by an injection current flows into the ADC. Therefore, the injection current flowing to the disabled port has an influence on the input port that is normally operated, which may have an adverse influence on an output value of the ADC.

SUMMARY OF THE INVENTION

Exemplary embodiments of the present invention provide an analog-to-digital converter (ADC) that can protect against the adverse effect of an injection current.

Exemplary embodiments of the present invention provide electronic circuits, including: a transmission circuit transmitting an input signal of a first node as an output signal of a second node in response to a control signal; and a discharge circuit selectively discharging the input signal of the first node in response to another control signal.

In exemplary embodiments, the discharge circuit discharges an overcurrent flowing into the first node during an off state when the transmission circuit does not transmit the input signal of the first node as the output signal of the second node in response to the control signal.

In exemplary embodiments, the transmission circuit includes; an inverter inverting the control signal to output an inverted control signal; a first transistor connected between the first node and the second node, the first transistor having a gate controlled by the control signal; and a second transistor connected in parallel with the first transistor between the first node and the second node, the second transistor having a gate controlled by the inverted control signal.

According to exemplary embodiments, the discharge circuit is connected between the first node and a ground voltage, and includes a pull-down transistor having a gate controlled by the inverted control signal.

In exemplary embodiments, the transmission circuit further includes: a first diode having an anode connected to the first node and a cathode connected to a power supply voltage; and a second diode having a cathode connected to the first node and an anode connected to a ground voltage.

Exemplary embodiments of the present invention provide analog-to-digital conversion circuits, including: a plurality of analog sources; a transmission circuit transmitting any one of a plurality of first analog signals outputted from the plurality of analog sources as a second analog signal in response to a control signal; and an analog-to-digital converter (ADC) converting the second analog signal to a digital signal, wherein the transmission circuit includes a discharge circuit selectively discharging the first analog signal in response to a control signal.

In exemplary embodiments, the transmission circuit includes a plurality of transmission units corresponding to a plurality of analog sources, respectively, and selectively outputting the first analog signals outputted from each of the corresponding analog sources as a second analog signal.

According to exemplary embodiments, each of the plurality of transmission units includes: an inverter inverting the control signal to output an inverted control signal; a first transistor connected between the first node and the second node, the first transistor having a gate controlled by the control signal; and a second transistor connected in parallel with the first transistor between the first node and the second node, the second transistor having a gate controlled by the inverted control signal.

In exemplary embodiments, each of the plurality of transmission units corresponds to each of a plurality of analog sources, and includes a discharge unit selectively discharging the first analog signal outputted from the corresponding analog source.

According to exemplary embodiments, the discharge circuit discharges an overcurrent flowing into the first node during an off state when the transmission circuit does not transmit the input signal of the first node as the output signal of the second node in response to a control signal.

In exemplary embodiments, the discharge unit is connected between the first node and a ground voltage, and includes a pull-down transistor having its gate controlled by the inverted control signal.

In exemplary embodiments, the ADC allows an error range within the least significant four bits of the digital signal.

BRIEF DESCRIPTION OF THE FIGURES

Exemplary embodiments of the present invention will be understood in more detail from the following descriptions taken in conjunction with the accompanying figures. In the figures.

DETAILED DESCRIPTION OF EXEMPLARY EMBODIMENTS

Exemplary Embodiment

Hereinafter, will be described an exemplary embodiment of the present invention in conjunction with the accompanying drawings.

Figure 1:
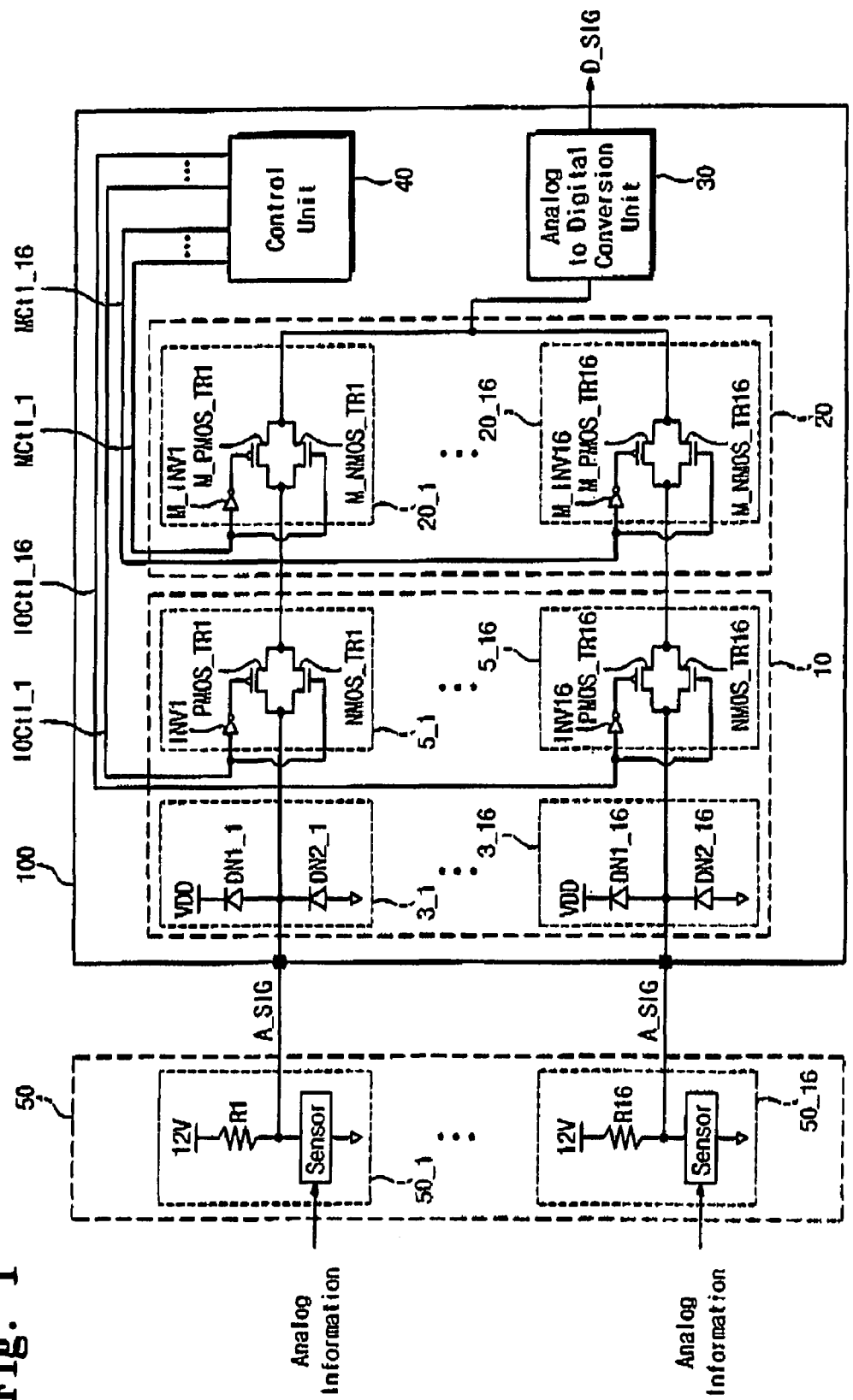
FIG. 1 is a circuit diagram of an analog-to-digital converter (ADC) including a multiplexer at an input port.

FIG. 1 is a circuit diagram of an analog-to-digital converter (ADC) 100 including a multiplexer at an input port. Referring to FIG. 1, the ADC 100 includes an input/output unit 10, a multiplexer unit 20, an analog-to-digital conversion unit 30, and a control unit 40.

The input/output unit 10 having sixteen input/output ports includes sixteen overvoltage protectors 3_1 through 3_16 and sixteen transmission gates 5_1 through 5_16 transmitting an analog signal from a sensor unit 50 to the multiplexer unit 20 under the control of the control unit 40.

Each of the overvoltage protectors 3_1 through 3_16, wherein two diodes DN1 and DN2 are connected in series, is connected to a ground voltage VSS at its anode side and connected to a power supply voltage VDD at its cathode side.

In the transmission gate 5_1, sources of a P-channel metal-oxide semiconductor (PMOS) transistor PMOS_TR1 and an N-channel metal-oxide semiconductor (NMOS) transistor NMOS_TR1 are connected in common, and drains of the PMOS transistor PMOS_TR1 and the NMOS transistor NMOS_TR1 are also connected in common. A gate of the NMOS transistor NMOS_TR1 is connected to receive a control signal IOCtl_1 that is also connected to an input of an inverter INV1, and a gate of the PMOS transistor PMOS_TR1 is connected to an output terminal of the inverter INV1 so as to receive an inverted control signal IOCtl_1. The other transmission gates 5_2 through 5_16 have structures substantially identical to that of the transmission gate 5_1 and each receives its own control signal from the control unit 40. Hence, the duplicate explanation will be omitted.

The multiplexer unit 20 includes transmission gates 20_1 through 20_16 forming sixteen input ports controlled by the control unit 40. Each of the transmission gates 20_1 through 20_16 of the multiplexer unit 20 has a structure substantially identical to that of the transmission gate 5_1. Hence, the duplicate explanation will also be omitted.

The control unit 40 controls the transmission gates 5_1 through 5_16 and 20_1 through 20_16 of the input/output unit 10 and the multiplexer unit 20 using the control signals IOCtl_1, IOCtl_16, MCtl_1 and MCtl_16, respectively.

The sensor unit 50 includes first through sixteenth sensor circuits 50_1 through 50_16. Each of the sensor circuits 50_1 through 50_16 includes a sensor and a pull-up resistor R1 through R16 connected to 12V. The sensor receives external analog information to output either a voltage or a current that is proportional to the analog information. Examples of the external analog information include temperature, pressure, humidity, voltage of a car battery, and the like. The pull-up resistor R1 through R16 connected to 12V pulls up an analog signal having a lower voltage level to a voltage level of 12V. The sensor unit 50 converts the analog information into an analog signal A_SIG.

The external analog information is converted into the analog signal A_SIG via the sensor unit 50, and the converted analog signal A_SIG is transmitted to the input/output unit 10. The input/output unit 10 protects the ADC against an overcurrent generated from the sensor unit 50, and transmits the analog signal A_SIG to the multiplexer unit 20 via the transmission gates 5_1 through 5_16 according to the control signals IOCtl_1 through IOCtl_16 from the control unit 40. The multiplexer unit 20 transmits only one analog signal A_SIG of the sixteen analog signals inputted from the input/output unit 10 to the analog-to-digital conversion unit 30 according to the control signals MCtl_1 through MCtl_16 from the control unit 40. The analog-to-digital conversion unit 30 serves the role of converting the analog signal A_SIG into a digital signal D_SIG. The following equations and relationships are used in the analysis of the system of FIG. 1.

$$Vsg = Vd \quad \text{(Equation 1)}$$

$$Vsg > |Vt| \quad \text{(Equation 2)}$$

$$Vsg < |Vt| \quad \text{(Equation 3)}$$

$$Isub = Id0\, e^{(Vsg - |Vt|)} \quad \text{(Equation 4)}$$

Vsg denotes a voltage between the source and the gate of the PMOS transistor, and Vd denotes a diode voltage. Vt is a threshold voltage of the PMOS transistor, and Id0 is a constant of, a subthreshold current I sub.

Equation 1 indicates that the voltage Vsg between the source and the gate of the PMOS transistor PMOS_TR1 of the transmission gate 5_1 is the same as the voltage Vd of the diode DN1 of the overvoltage protector 3_1. When the diode voltage Vd is greater than the threshold voltage Vt, a channel is formed inside the PMOS transistor PMOS_TR1 according to Equation 2 to open the transmission gate 5_1 of the input/output unit 10 and the transmission gate 20_1 of the multiplexer unit 20. On the contrary, when the diode voltage Vd is less than the threshold voltage Vt, a subthreshold region is formed inside the PMOS transistor PMOS_TR1 according to Equation 3. Therefore, a current Isub according to Equation 4 flows.

For example, the voltage of 12V is applied to the input/output unit 10 through the resistor $R_1$ when the sensor of the first sensor circuit 50_1 of the sensor unit 50 breaks down.

Even in the case where the PMOS transistor PMOS_TR1 is turned off, the channel is formed inside the PMOS transistor PMOS_TR1 according to Equation 2 when the voltage Vsg is greater than the power supply voltage VDD. Therefore, the current Isub according to Equation 4 increases exponentially. Accordingly, since the PMOS transistor PMOS_TR1 of the transmission gate 5_1 of the input/output unit 10 and the PMOS transistor PMOS_TR1 of the transmission gate 20_1 of the multiplexer unit 20 are opened, a malfunction of the ADC 100 is caused.

Generally, the diode voltage Vd is about 0.7V. Hence, a problem of an injection current can be solved when a process parameter is adjusted such that an absolute value of the threshold voltage Vt of the PMOS transistor is considerably greater than the diode voltage Vd. There is a limitation in adjusting the process parameter, however, because the adjustment of the process parameter has an influence on the characteristics of the transistor.

Therefore, exemplary embodiments of the present invention provide an apparatus for protecting against an injection current from flowing into the ADC by changing an injection current path.

Figure 2:
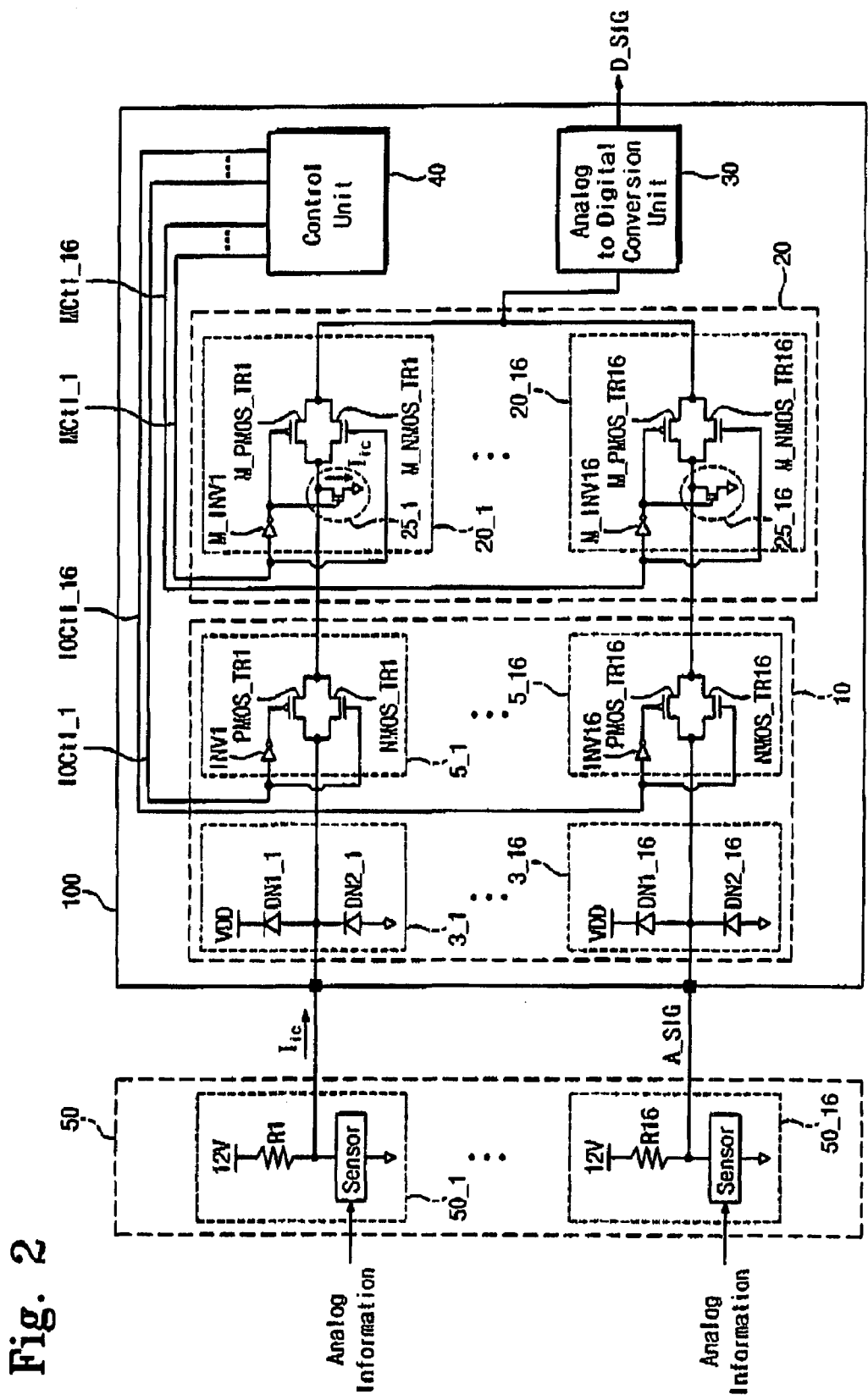
FIG. 2 is a circuit diagram of an ADC according to an exemplary embodiment of the present invention.

FIG. 2 is a circuit diagram of an ADC 100 according to an exemplary embodiment of the present invention. Referring to FIG. 2, the ADC 100 includes pull-down transistors 25_1 through 25_16 in a multiplexer unit 20, so as to protect the ADC against the effect of an injection current $I_{ic}$.

An analog signal A_SIG transmitted from a first sensor among the sixteen sensors of a sensor unit 50 is transmitted to a multiplexer unit 20 via a transmission gate 5_1 of an input/output unit 10 according to a control signal IOCtl_1 from a control unit 40. The other fifteen transmission gates 5_2 through 5_16 in the input/output unit 10, to which the analog signal is not transmitted, are disabled according to control signals IOCtl_2 through IOCtl_16 from the control unit 40.

The multiplexer unit 20 transmits the analog signal to an analog-to-digital conversion unit 30 via a transmission gate 20_1 in response to a control signal MCtl_1 from the control unit 40. The other fifteen transmission gates 20_2 through 20_16 in the multiplexer unit 20, to which the analog signal is not transmitted, are disabled according to control signals MCtl_2 through MCtl_16 from the control unit 40.

For example, in the case where the analog signal is transmitted through the sixteenth sensor 50_16 of the sensor unit 50, an injection current $I_{ic}$ is propagated to the input/output unit 10 when an error occurs in the first sensor 50_1 of the sensor unit 50. The transmission gate 5_1 of the input/output unit 10 is cut off according to the control signal IOCtl_1 of the control unit 40. When the injection current $I_{ic}$ is greater than the threshold voltage Vt of a PMOS transistor PMOS_TR1 of the transmission gate 5_1, however, the PMOS transistor PMOS_TR1 is turned on so that the injection current $I_{ic}$ is propagated to the multiplexer unit 20.

According to an exemplary embodiment of the present invention, injection current $I_{ic}$, however, is caused to flow into a ground by the pull-down transistor 25_1 of the multiplexer unit 20. Only the enabled transmission gate 20_16 of the multiplexer unit 20 transmits the analog signal to the analog to digital conversion unit 30. Accordingly, since the injection current $I_{ic}$, is cut off by the pull-down transistor 25_1 of the multiplexer unit 20, the injection current $I_{ic}$ does not have any influence on the analog-to-digital conversion unit 30.

Generally, in the case of an automotive semiconductor product sensitively responding to signal distortion caused by the injection current $I_{ic}$, the injection current and an induced current are measured and they are regulated so as not to exceed a predetermined value.

Figure 3:
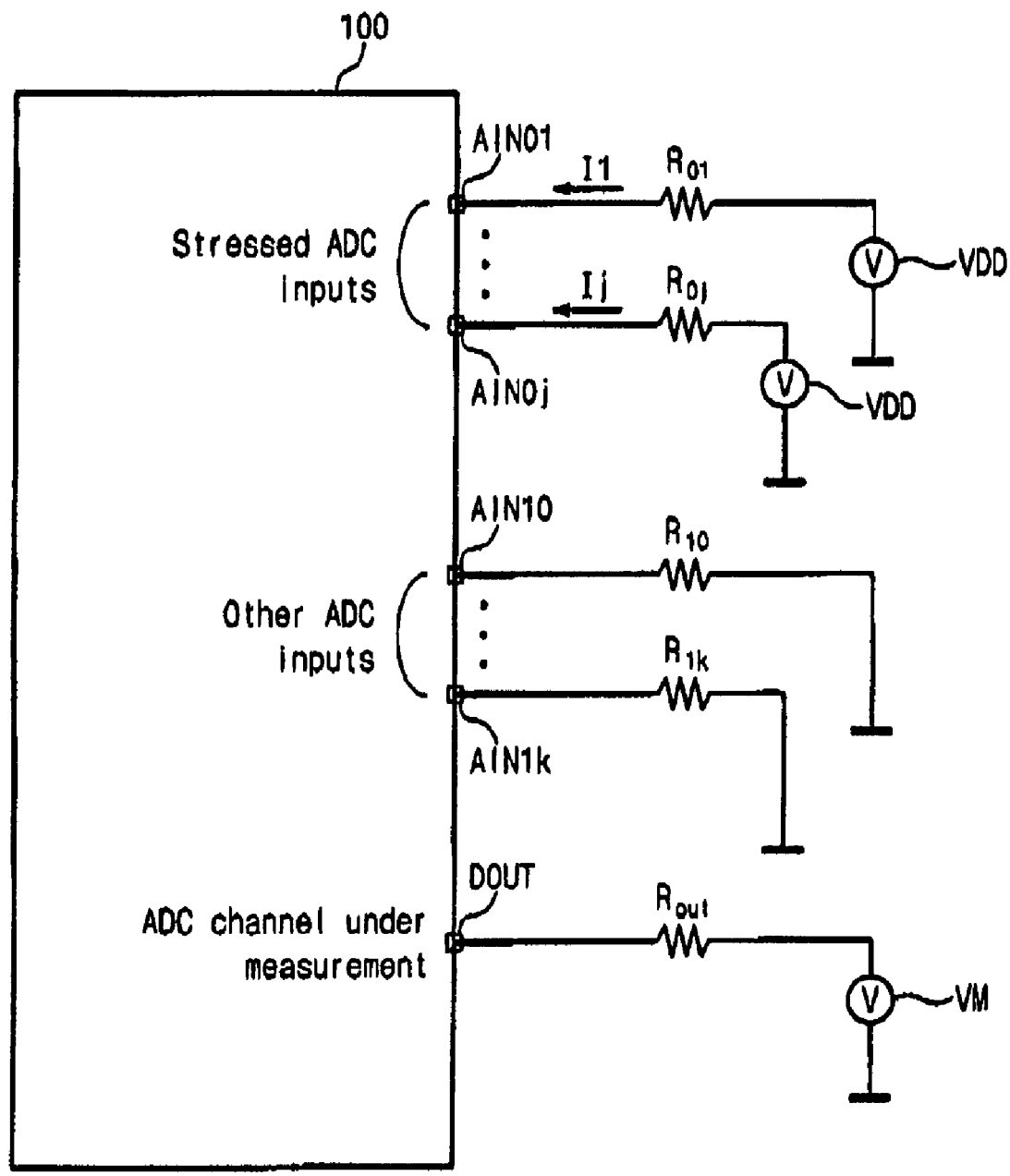
FIG. 3 is a circuit diagram illustrating an exemplary embodiment of a method of measuring the conversion accuracy of an ADC due to an effect of an injection current.

FIG. 3 is a circuit diagram useful in explaining a method of measuring the conversion accuracy of the ADC due to an effect of an injection current.

An accuracy test of an ADC 100 is to measure how well the accuracy of the ADC 100 is maintained when an operation of the ADC 100 is performed in a state where the injection current $I_{ic}$ is applied to ports that do not convert an analog signal A_SIG to a digital signal D_SIG, as shown in FIG. 2. In an automotive semiconductor product, a maximum allowable total injection current is about 5 mA, and an analog-to-digital conversion value is within 16 least significant bits, which means that the analog-to-digital conversion value is only varied within 4 bits based on a least significant bit (LSB), when the analog signal influenced by the injection current is converted into the digital signal.

Referring to FIGS. 2 and 3, an injection current $I_i$ through $I_j$, of which the magnitude is 1 mA or less, is applied to each of stressed ADC input ports AIN0*l* through AIN0*j* of the ADC 100. The injection current $I_i$ through $I_j$ is generated by applying a voltage VDD across each of resistors $R_{01}$ through $R_{0j}$. The total amount of current applied to the stressed ADC input ports AIN0*l* through AIN0*j* is set to a maximum of 5 mA or less. Other ADC input ports AINl0 through AINlk are connected to a ground voltage VSS through resistors $R_{l0}$ through $R_{lk}$, respectively. A resistor $R_{out}$ and a voltage meter VM are connected to each other in series at an ADC channel under measurement terminal DOUT.

The accuracy test of an ADC 100 due to the effect of the injection current is to measure whether a digital signal D_SIG from the ADC 100 has an error range within 4 bits based on the LSB using the voltage meter VM.

Figure 4:
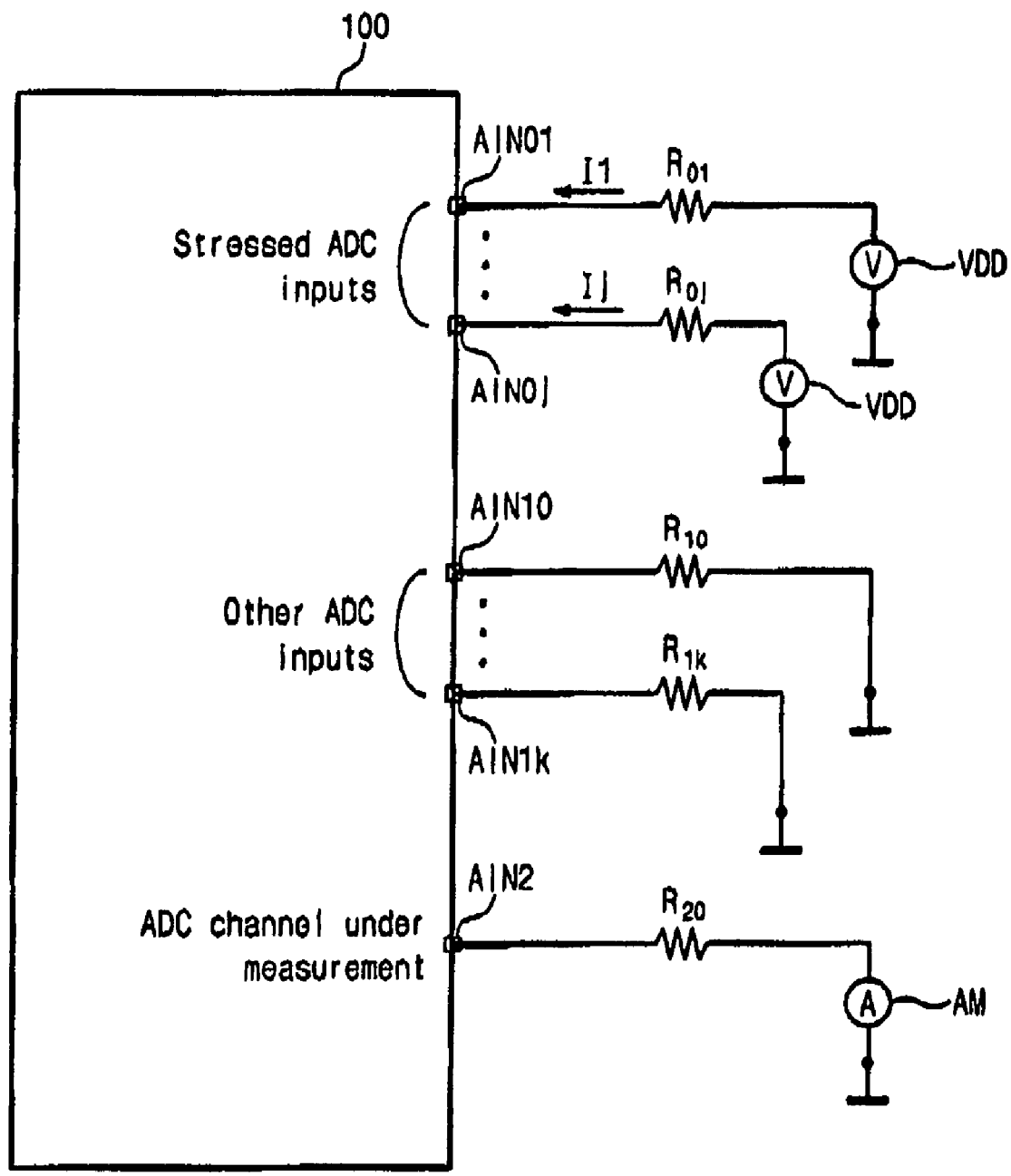
FIG. 4 is a circuit diagram illustrating an exemplary embodiment of a method of measuring the amount of an induced current of an ADC due to an injection current.

FIG. 4 is a circuit diagram useful in explaining a method of measuring the amount of induced current of an ADC due to an injection current.

An induced current test of an ADC 100 is to measure a current at one port of the ADC 100 to determine whether the measured current is within a reference value in a state where an injection current is applied to ports that do not convert an analog signal to a digital signal.

In an automotive semiconductor product, an allowable induced current is about 5 μA, when a maximum allowable total injection current is about 5 mA.

Referring to FIGS. 2 and 4, the injection current $I_i$ through $I_j$, the magnitude of which is 1 mA or less, is applied to each of the stressed ADC input ports AIN0*l* through AIN0*j*. The injection current $I_i$ through $I_j$ is generated by applying a voltage VDD across each of resistors $R_{01}$ through $R_{0j}$. The total amount of current applied to the stressed ADC input ports AIN0*l* through AIN0*j* is set to 5 mA or less at a maximum. Other ADC input ports AINl0 through AINlk are connected to a ground voltage VSS through resistors $R_{l0}$ through $R_{lk}$, respectively. A resistor $R_{20}$ and a current meter AM are connected to each other in series at an ADC channel under measurement terminal AIN2. The induced current is an inverse current flowing toward the ADC channel under measurement AIN2 by the injection currents $I_1$ through $I_j$.

An induced current test of the ADC 100 measures whether the induced current is within 5 μA using the current meter AM.

An exemplary embodiment of the present invention provides an ADC that can protect against the adverse effect of an injection current caused by a malfunction of a sensor.

As described above, according to exemplary embodiments of the present invention, an ADC can protect against the adverse effect of the injection current by using a pull-down transistor.

The above-disclosed subject matter is to be considered illustrative, and not restrictive, and the appended claims are intended to cover all such modifications, enhancements, and exemplary embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An analog to digital conversion circuit, comprising:
    a plurality of analog signal sources;
    a transmission circuit transmitting any one of a plurality of first analog signals outputted from the plurality of analog signal sources as a second analog signal in response to a control signal; and
    an analog to digital converter (ADC) converting the second analog signal to a digital signal,
    wherein the transmission circuit includes a discharge circuit selectively discharging the first analog signal in response to the control signal.

2. The analog to digital conversion circuit of claim 1, wherein the ADC allows an error range within the least significant 4 bits of the digital signal.

3. The analog to digital conversion circuit of claim 1, wherein the transmission circuit comprises a plurality of transmission units corresponding to the plurality of analog signal sources, respectively, and selectively outputs the first analog signal outputted from each of the corresponding analog signal sources as the second analog signal.

4. The analog to digital conversion circuit of claim 3, wherein each of the plurality of transmission units comprises:
   an inverter inverting the control signal to output an inverted control signal;
   a first transistor connected between the first node and the second node, the first transistor having a gate controlled by the control signal; and
   a second transistor connected in parallel with the first transistor between the first node and the second node, the second transistor having a gate controlled by the inverted control signal.

5. The analog to digital conversion circuit of claim 3, wherein each of the plurality of transmission units corresponds to each of the analog signal sources, and the discharge circuit selectively discharges the first analog signal outputted from the corresponding analog source.

6. The conversion circuit of claim 5, wherein the discharge circuit is connected between the first node and a ground voltage, and comprises a pull down transistor having a gate controlled by the inverted control signal.

7. The analog to digital conversion circuit of claim 3, wherein the discharge circuit discharges an overcurrent flowing into the first node during an off state when the transmission circuit does not transmit the input signal of the first node as the output signal of the second node in response to the control signal.

* * * * *